(12) United States Patent
Hwang et al.

(10) Patent No.: US 11,768,414 B2
(45) Date of Patent: Sep. 26, 2023

(54) DISPLAY DEVICE AND DRIVING METHOD OF THE SAME

(71) Applicant: LG Display Co., Ltd., Seoul (KR)

(72) Inventors: Jeong-Tae Hwang, Paju-si (KR); Seung-Tae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/559,183

(22) Filed: Dec. 22, 2021

(65) Prior Publication Data

US 2022/0206351 A1   Jun. 30, 2022

(30) Foreign Application Priority Data

Dec. 30, 2020   (KR) .................. 10-2020-0187806

(51) Int. Cl.
*G02F 1/1362*      (2006.01)
*G09G 3/36*        (2006.01)
(Continued)

(52) U.S. Cl.
CPC ...... *G02F 1/136286* (2013.01); *G02F 1/1368* (2013.01); *G09G 3/3291* (2013.01);
(Continued)

(58) Field of Classification Search
CPC ............. H01L 27/3276; H01L 27/3218; H01L 27/1214; H01L 27/124; G09G 3/3688; G09G 3/3291; G09G 3/3648; G09G 2300/0426; G09G 2320/0219; G09G 2300/043; G09G 3/3614; G09G 3/3607; G09G 2330/021; G09G 2320/0276; G09G 2310/0297; G09G 2310/0248; G09G 2310/0213; G09G 3/3677; G09G 2300/0452; G09G 2320/0233;
(Continued)

(56) References Cited

U.S. PATENT DOCUMENTS

| | | | |
|---|---|---|---|
| 8,502,948 B2 * | 8/2013 | Su ..................... | G09G 3/3614 |
| | | | 349/139 |
| 2005/0041006 A1 * | 2/2005 | Lee ..................... | G09G 3/2011 |
| | | | 345/99 |

(Continued)

FOREIGN PATENT DOCUMENTS

| | | |
|---|---|---|
| CN | 101000414 A | 7/2007 |
| CN | 101266744 A | 9/2008 |

(Continued)

OTHER PUBLICATIONS

Chinese Office Action dated Jan. 29, 2023 issued in Patent Application No. 202111613548.X w/English Translation (15 pages).

*Primary Examiner* — Hoan C Nguyen
(74) *Attorney, Agent, or Firm* — POLSINELLI PC

(57) ABSTRACT

A display device includes first and second gate lines extending in a first direction; first and second data lines extending in a second direction and crossing the first and second gate lines; and a first horizontal pixel row including first, second, and third sub-pixels sequentially arranged in the first direction, wherein the first sub-pixel is connected to the first gate line and the first data line, the second sub-pixel is connected to the second gate line and the first data line, and the third sub-pixel is connected to the first gate line and the second data line.

17 Claims, 6 Drawing Sheets

(51) Int. Cl.
  *G09G 3/3291* (2016.01)
  *G02F 1/1368* (2006.01)
  *H10K 59/131* (2023.01)
  *H10K 59/35* (2023.01)
(52) U.S. Cl.
  CPC ......... *G09G 3/3688* (2013.01); *H10K 59/131* (2023.02); *H10K 59/353* (2023.02)
(58) Field of Classification Search
  CPC ........... G09G 2330/023; G09G 3/2074; G09G 3/2003; G09G 3/3696; G02F 1/1368; G02F 1/136286; G02F 1/13606; G02F 1/136218; G02F 1/134309; G02F 1/134345; G02F 1/1362; G02F 1/136222
  See application file for complete search history.

(56) References Cited

U.S. PATENT DOCUMENTS

| | | | |
|---|---|---|---|
| 2009/0027325 A1 | 1/2009 | Kim et al. | |
| 2009/0135125 A1* | 5/2009 | Park | G02F 1/136286 345/98 |
| 2010/0073617 A1* | 3/2010 | Han | G02F 1/136286 349/143 |
| 2010/0109994 A1* | 5/2010 | Lee | G09G 3/3614 345/98 |
| 2015/0179121 A1* | 6/2015 | Lee | G02F 1/136227 345/103 |

FOREIGN PATENT DOCUMENTS

| | | | | |
|---|---|---|---|---|
| CN | 101527114 A | | 9/2009 | |
| CN | 105206211 A | | 12/2015 | |
| CN | 105575322 A | | 5/2016 | |
| CN | 109671405 A | | 4/2019 | |
| CN | 110456585 A | * | 11/2019 | ........... G09G 3/3688 |
| CN | 111627388 A | | 9/2020 | |
| EP | 2960895 A2 | * | 12/2015 | ....... G02F 1/134309 |
| EP | 3089147 | | 11/2016 | |
| KR | 10-2013-0120821 A | | 11/2013 | |
| KR | 10-2019-0076319 A | | 7/2019 | |
| KR | 10-2019-0140715 A | | 12/2019 | |
| KR | 10-2020-0005367 A | | 1/2020 | |

* cited by examiner

DISPLAY DEVICE AND DRIVING METHOD OF THE SAME

CROSS-REFERENCE TO RELATED APPLICATION

The present application claims the priority of Korean Patent Application No. 10-2020-0187806 filed on Dec. 30, 2020, which is hereby incorporated by reference in its entirety.

BACKGROUND

Field of the Disclosure

The present disclosure relates to a display device and a driving method of the same, and more particularly, to a display device and a driving method of the same in which gate lines and data lines are alternately shared.

Description of the Background

Recently, flat panel display devices have been widely developed and applied to various fields because of their thin profile, light weight, and low power consumption.

Among the flat panel display devices, liquid crystal display devices (LCD), organic light emitting diode display devices (OLED), micro light emitting diode display devices (µ-LED), and quantum dot light emitting diode display devices (QLED) have been widely developed and applied.

Theses display devices display an image by supplying a data voltage output from a data driving portion to pixels of a display panel. As the resolution increases, the number of pixels increases, and the size and number of the data driving portion increase, thereby increasing the manufacturing costs of the display device.

To solve the problem, a structure has been suggested in which data signals are supplied to pixel regions at both sides of a data line through the data line. However, in this case, the time of applying the data voltage to each pixel region is decreased, and the data charging time for the data line is considerably reduced. Accordingly, the display quality is lowered.

SUMMARY

Accordingly, the present disclosure is directed to a display device and a driving method of the same that substantially obviate one or more of the problems due to limitations and disadvantages described above.

More specifically, the present disclosure is to provide a display device and a driving method of the same that decrease the size and number of the data driving portion and reduce the manufacturing costs.

The present disclosure is also to provide a display device and a driving method of the same that secure sufficient data charging time.

Additional features and aspects will be set forth in the description that follows, and in part will be apparent from the description provided herein. Other features and aspects of the present disclosure may be realized and attained by the structure particularly pointed out in the written description, or derivable therefrom, and the claims hereof as well as the appended drawings.

To achieve these and other aspects of the present disclosure, as embodied and broadly described herein, a display device includes first and second gate lines extending in a first direction; first and second data lines extending in a second direction and crossing the first and second gate lines; and a first horizontal pixel row including first, second, and third sub-pixels sequentially arranged in the first direction, wherein the first sub-pixel is connected to the first gate line and the first data line, the second sub-pixel is connected to the second gate line and the first data line, and the third sub-pixel is connected to the first gate line and the second data line.

In another aspect, a driving method of a display device, which includes a first horizontal pixel row including first, second, and third sub-pixels sequentially disposed in a first direction and a second horizontal pixel row including fourth, fifth, and sixth sub-pixels sequentially disposed in the first direction, comprises applying data voltages to the first and third sub-pixels for a first section; applying data voltages to the second and fifth sub-pixels for a second section; and applying data voltages to the fourth and sixth sub-pixels for a third section.

In another aspect, a driving method of a display device, which includes a first horizontal pixel row including first, second, third, fourth, fifth, and sixth sub-pixels sequentially arranged in a first direction and a second horizontal pixel row including seventh, eighth, ninth, tenth, eleventh, and twelfth sub-pixels sequentially arranged in the first direction, comprises a first step of applying data voltages to the first and third sub-pixels for a first section; a second step of applying data voltages to the second and eighth sub-pixels for a second section; and a third step of applying data voltages to the seventh and ninth sub-pixels for a third section.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of the present disclosure, illustrate an aspect of the present disclosure and together with the description serve to explain principles of the present disclosure.

In the drawings.

DETAILED DESCRIPTION

Reference will now be made in detail to exemplary aspects of the disclosure, examples of which are illustrated in the accompanying drawings.

Figure 1:
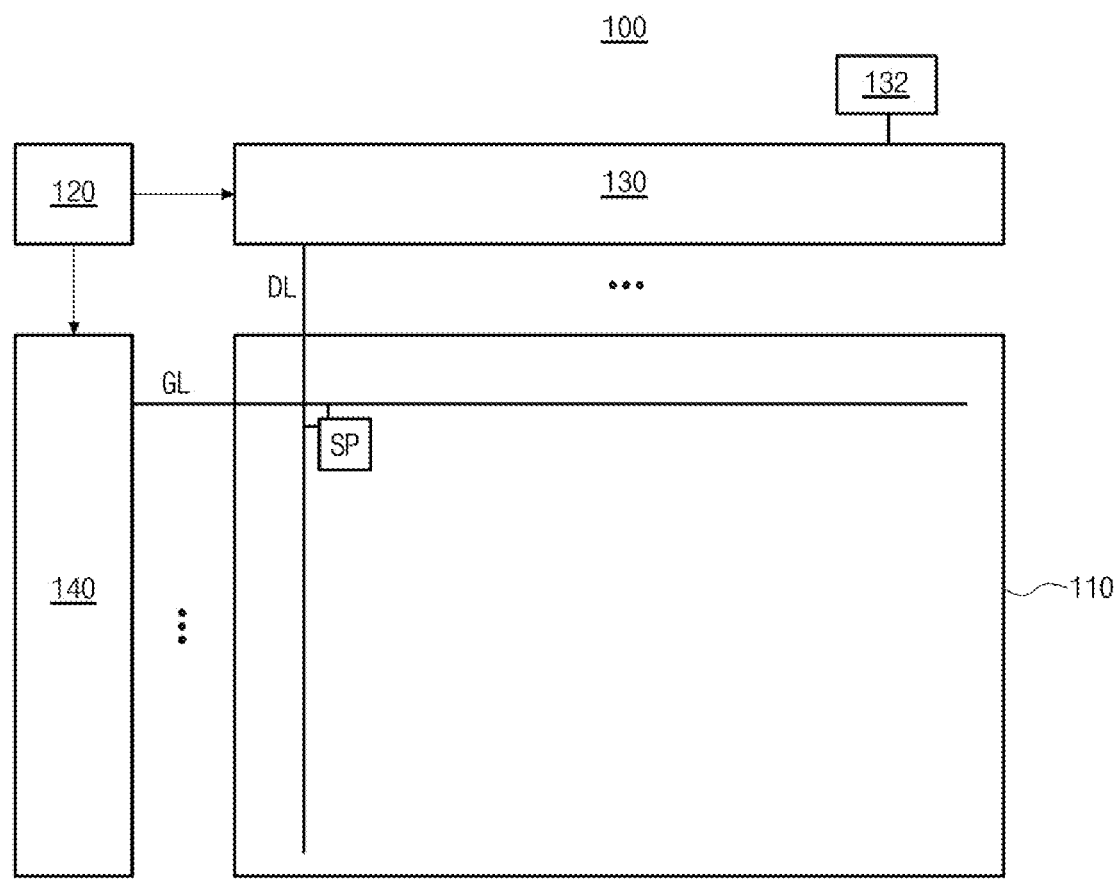
FIG. 1 is a schematic view of a display device according to the present disclosure.

FIG. 1 is a schematic view of a display device according to the present disclosure.

In FIG. 1, the display device 100 according to the aspect of the present disclosure includes a display panel 110, a timing control portion 120, a data driving portion 130, a gamma portion 132, and a gate driving portion 140.

The timing control portion 120 generates an image data, a data control signal, and a gate control signal using an image signal and timing signals of a data enable signal, a horizontal synchronization signal, a vertical synchronization signal, and a clock transmitted from an external system (not shown) such as a graphic card or a television system. The timing control portion 120 transmits the image data and the data control signal to the data driving portion 130 and transmits the gate control signal to the gate driving portion 140.

The data driving portion 130 generates a data voltage of a data signal using the data control signal and the image data transmitted from the timing control portion 120 and applies the data voltage to a data line DL of the display panel 110.

The gamma part 132 transmits the data voltage corresponding to the image data of the data driving portion 130 to the data driving portion 130.

The gate driving portion 140 generates a gate voltage of a gate signal using the gate control signal transmitted from the timing control portion 120 and applies the gate voltage to a gate line GL of the display panel 110.

The gate driving portion 140 may have a gate-in-panel (GIP) type where the gate driving portion 140 is disposed on a substrate of the display panel 110 on which the gate line GL, the data line DL, and a sub-pixel SP are formed.

The display panel 110 displays an image using the gate voltage and the data voltage. To do this, the display panel 110 includes a plurality of sub-pixels SP, a plurality of gate lines GL, and a plurality of data lines DL, which are disposed in a display area. Each sub-pixel SP is connected to one gate line GL and one data line DL.

Each sub-pixel SP expresses one color, and several sub-pixels SP expressing different colors constitute one pixel. One pixel may include three sub-pixels SP. For example, one pixel may include red, green, and blue sub-pixels.

Alternatively, one pixel may include four sub-pixels SP. For example, one pixel may include red, green, blue, and white sub-pixels, and the red, white, green, and blue sub-pixels are sequentially arranged. In a different way, one pixel may include one red and blue sub-pixels and two green sub-pixels, and the red, green, blue, and green sub-pixels may be arranged in order. However, the present disclosure is not limited thereto.

Figure 2:
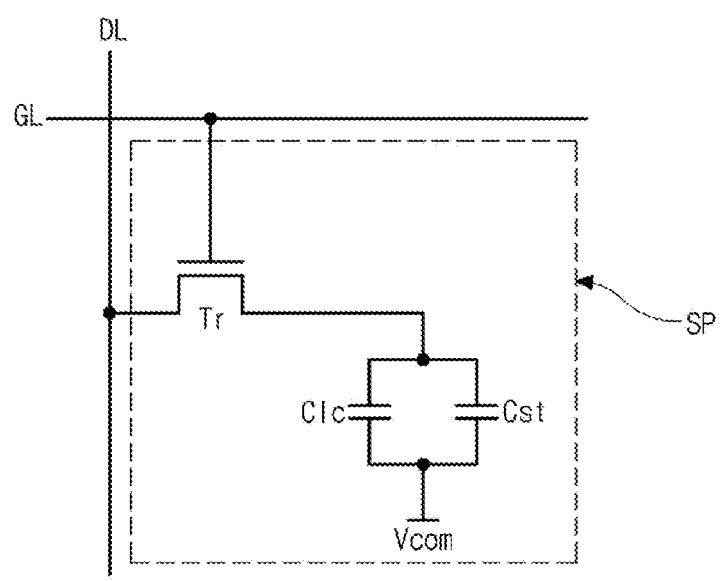
FIG. 2 is a circuit diagram of one sub-pixel of a liquid crystal display device according to the present disclosure.

The display device according to the aspect of the present disclosure may be a liquid crystal display device, and the sub-pixel SP may have the configuration of FIG. 2. At this time, the liquid crystal display device further includes a backlight unit under the display panel 110 to provide light to the display panel 110.

FIG. 2 is a circuit diagram of one sub-pixel of a liquid crystal display device according to the present disclosure.

In FIG. 2, the liquid crystal display device according to the aspect of the present disclosure includes a plurality of gate lines and a plurality of data lines crossing each other to define a plurality of sub-pixels. Particularly, in the example of FIG. 2, a gate line GL and a data line DL cross each other to define a sub-pixel SP. A thin film transistor Tr, a liquid crystal capacitor Clc, and a storage capacitor Cst are formed in each sub-pixel SP.

More specifically, a gate electrode of the thin film transistor Tr is connected to the gate line GL, and a source electrode of the thin film transistor Tr is connected to the data line DL. A drain electrode of the thin film transistor Tr is connected to a pixel electrode of the liquid crystal capacitor Clc and a first electrode of the storage capacitor Cst. A common electrode of the liquid crystal capacitor Clc and a second electrode of the storage capacitor Cst are connected to a common voltage supply Vcom.

The liquid crystal capacitor Clc includes the pixel electrode, the common electrode, and a liquid crystal layer interposed therebetween.

The liquid crystal display device is driven to display an image. For example, when the thin film transistor Tr is turned on by a gate signal applied through the gate line GL, a data voltage from the data line DL is applied to the pixel electrode of the liquid crystal capacitor Clc.

An arrangement of liquid crystal molecules is changed according to the magnitude of the data voltage, and the image is displayed by selectively transmitting light from the backlight unit. At this time, the amount of the transmitted light depends on the magnitude of the data voltage.

The storage capacitor Cst maintains charges corresponding to the data signal for a frame to make the arrangement of the liquid crystal molecules constant and to constantly maintain the gray level due to the transmitted light.

Figure 3:
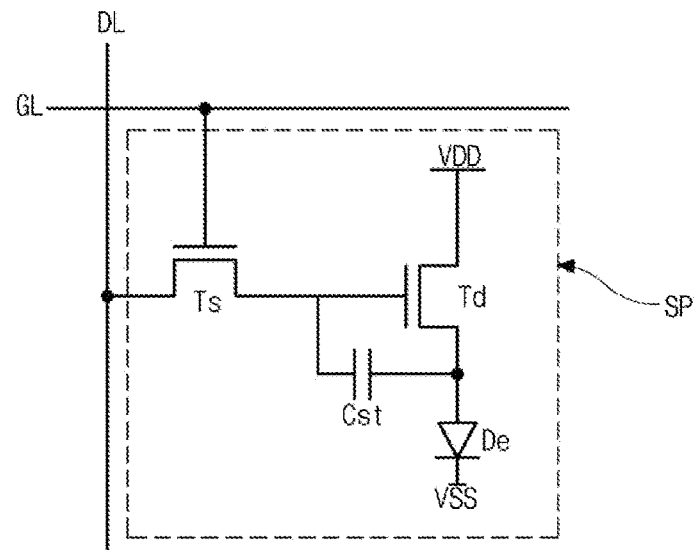
FIG. 3 is a circuit diagram of one sub-pixel of an organic light emitting diode display device according to the present disclosure.

Alternatively, the display device according to the aspect of the present disclosure may be an organic light emitting diode display device, and the sub-pixel SP may have the configuration of FIG. 3.

FIG. 3 is a circuit diagram of one sub-pixel of an organic light emitting diode display device according to the aspect of the present disclosure.

In FIG. 3, the organic light emitting diode display device according to the present disclosure includes a plurality of gate lines and a plurality of data lines crossing each other to define a plurality of sub-pixels. Particularly, in the example of FIG. 3, a gate line GL and a data line DL cross each other to define a sub-pixel SP. A switching thin film transistor Ts, a driving thin film transistor Td, a storage capacitor Cst, and a light emitting diode De are formed in each sub-pixel SP.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high potential voltage supply VDD. An anode of the light emitting diode De is connected to a drain electrode of the driving thin film transistor Td, and a cathode of the light emitting diode De is connected to a low potential voltage supply VSS. The storage capacitor Cst is connected to the gate electrode and the drain electrode of the driving thin film transistor Td.

The organic light emitting diode display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light emitting diode De is controlled, thereby displaying an image. The light emitting diode De emits light due to the current supplied through the driving thin film transistor Td from the high potential voltage supply VDD.

Namely, the amount of the current flowing through the light emitting diode De is proportional to the magnitude of the data signal, and the intensity of light emitted by the light emitting diode De is proportional to the amount of the current flowing through the light emitting diode De. Thus, the sub-pixels SP show different gray levels depending on the magnitude of the data signal, and as a result, the organic light emitting diode display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode De to be constant and the gray level shown by the light emitting diode De to be maintained until a next frame.

Meanwhile, one or more thin film transistors and/or capacitors can be added in the sub-pixel SP in addition to the switching and driving thin film transistors Ts and Td and the storage capacitor Cst.

For example, in the e organic light emitting diode display device, the driving thin film transistor Td is turned on for a relatively long time while the data signal is applied to the gate electrode of the driving thin film transistor Td and the light emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the sub-pixel SP of the organic light emitting diode display device displays a different gray level with respect to the same data signal. This causes non-uniform luminance, thereby lowering the image quality of the organic light emitting diode display device.

Accordingly, to compensate the change of the mobility and/or threshold voltage of the driving thin film transistor Td, at least one sensing thin film transistor and/or capacitor for sensing a voltage change can be further added in the sub-pixel SP. The sensing thin film transistor and/or capacitor can be connected to a reference line for applying a reference voltage and outputting a sensing voltage.

As described above, each sub-pixel SP is connected to one gate line GL and one data line DL. In general, the display device has a single rate driving (SRD) structure in which the sub-pixels SP of one horizontal pixel row are connected to the same gate line GL and the sub-pixels SP of one vertical pixel column are connected to the same data line DL.

By the way, in the display device of the SRD structure, as the resolution increases, the number of data lines DL significantly increases, so that the size and/or number of the data driving portion increases, thereby increasing the manufacturing costs of the display device.

To solve this, a display device of a dual rate driving (DRD) structure has been proposed in which adjacent sub-pixels SP of one horizontal pixel row share one data line DL.

However, in the display device of the DRD structure, since the adjacent sub-pixels SP of the horizontal pixel row are connected to different gate lines GL, the time for applying the data voltage to each sub-pixel SP is reduced by half compared to the display device of the SRD structure. Thus, the data charging time is not enough, thereby decreasing the display quality.

Accordingly, in the present disclosure, by configuring the plurality of sub-pixels SP to alternately share the gate lines GL and the data lines DL, the number of the data lines DL decreases, and the size and/or number of the data driving portion decrease, so that the data charging time can be sufficiently secured.

A display device according to a first aspect of the present disclosure having such a configuration will be described with reference to FIG. 4.

Figure 4:
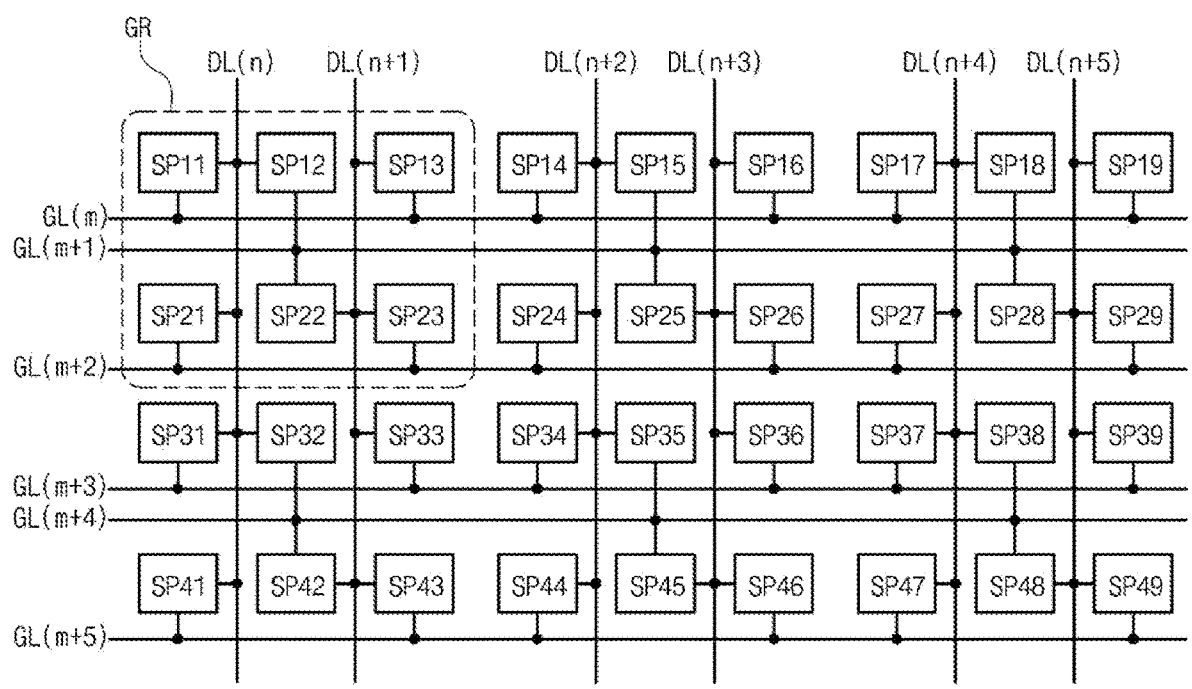
FIG. 4 is a schematic view of a display device according to a first aspect of the present disclosure.

FIG. 4 is a schematic view of a display device according to a first aspect of the present disclosure.

In FIG. 4, the display device according to the first aspect of the present disclosure includes a plurality of gate lines GL(m) to GL(m+5), a plurality of data lines DL(n) to DL(n+5), and a plurality of sub-pixels SP11 to SP49. Here, m and n are natural numbers.

The plurality of gate lines GL(m) to GL(m+5) extend in a first direction, and the plurality of data lines DL(n) to DL(n+5) extend in a second direction and cross the plurality of gate lines GL(m) to GL(m+5).

When m and n are 1, the plurality of gate lines GL(m) to GL(m+5) may be first to sixth gate lines GL1 to GL6, respectively, and the plurality of data lines DL(n) to DL(n+5) may be first to sixth data lines DL1 to DL6, respectively.

The plurality of sub-pixels SP11 to SP49 are arranged in a matrix form, and each of the sub-pixels SP11 to SP49 is connected to one gate line and one data line. At this time, three sub-pixels included in one horizontal pixel row are connected to two gate lines and two data lines.

The plurality of sub-pixels SP11 to SP49 may include first to thirty-sixth sub-pixels, and the sub-pixels SP11 to SP49 may be arranged in four rows and nine columns.

Here, in the sub-pixels SP11 to SP49, six sub-pixels of two rows and three columns form one group and are repeatedly arranged with the same connection structure for three gate lines and two data lines.

For example, six sub-pixels SP11, SP12, SP13, SP21, SP22, and SP23 arranged in two rows and three columns may form one group GR and may be defined as first, second, third, fourth, fifth, and sixth sub-pixels, respectively. At this time, a first horizontal pixel row of a first row may include the first, second, and third sub-pixels SP11, SP12, and SP13 sequentially arranged in the first direction, and a second horizontal pixel row of a second row may include the fourth, fifth, and sixth sub-pixels SP21, SP22, and SP23 sequentially arranged in the first direction. The first, second, third, fourth, fifth, and sixth sub-pixels SP11, SP12, SP13, SP21, SP22, and SP23 are connected to first, second, and third gate lines GL(m), GL(m+1), and GL(m+2) and first and second data lines DL(n) and DL(n+1).

Specifically, the first sub-pixel SP11 is connected to the first gate line GL(m) and the first data line DL(n), the second sub-pixel SP12 is connected to the second gate line GL(m+1) and the first data line DL(n), the third sub-pixel SP13 is connected to the first gate line GL(m) and the second data line DL(n+1), the fourth sub-pixel SP21 is connected to the third gate line GL(m+2) and the first data line DL(n), the fifth sub-pixel SP22 is connected to the second gate line GL(m+1) and the second data line DL(n+1), and the sixth sub-pixel SP23 is connected to the third gate line GL(m+2) and the second data line DL(n+1).

Next, the six sub-pixels SP14, SP15, SP16, SP24, SP25, and SP26 arranged in two row and three columns are connected to the first, second, and third gate lines GL(m), GL(m+1), and GL(m+2) and the third and fourth data lines DL(n+2) and DL(n+3) in the same way.

In addition, the six sub-pixels SP31, SP32, SP33, SP41, SP42, and SP43 are connected to the fourth, fifth, and sixth gate lines GL(m+3), GL(m+4), and GL(m+5) and the first and second data lines DL(n) and DL(n+1) in the same way.

A driving method of the display device according to the first aspect of the present disclosure will be described with reference to FIG. 5.

Figure 5:
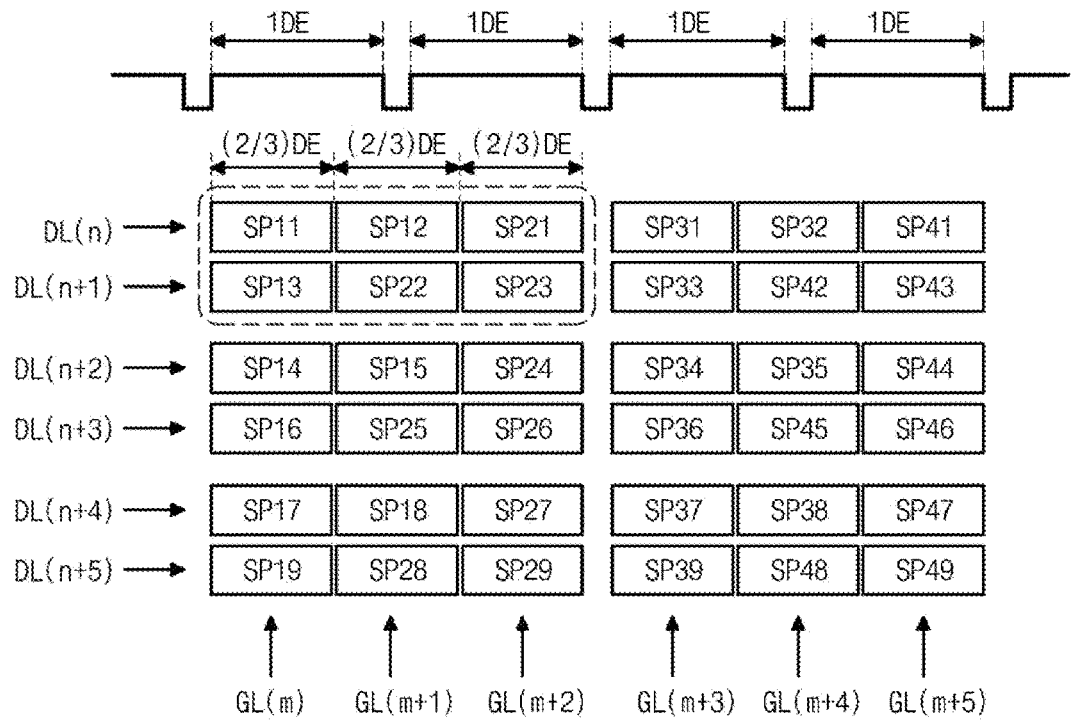
FIG. 5 is a timing diagram of the display device according to the first aspect of the present disclosure.

FIG. 5 is a timing diagram of the display device according to the first aspect of the present disclosure, and it will be described with reference to FIG. 4 together.

In FIG. 5, data voltages are applied to the first, second, third, fourth, fifth, and sixth sub-pixels SP11, SP12, SP13, SP21, SP22, and SP23 of two horizontal pixel rows for two horizontal periods 2H in which two data enable (DE) signals are applied. That is, the first, second, third, fourth, fifth, and sixth sub-pixels SP11, SP12, SP13, SP21, SP22, and SP23 have the data charging time of 2DE.

At this time, the data voltages are applied to the first sub-pixel SP11 and the third sub-pixel SP13 for a first section in which the gate signal is applied to the first gate line GL(m), the data voltages are applied to the second sub-pixel SP12 and the fifth sub-pixel SP22 for a second section in which the gate signal is applied to the second gate line GL(m+1), and the data voltages are applied to the fourth sub-pixel SP21 and the sixth sub-pixel SP23 for a third section in which the gate signal is applied to the third gate line GL(m+2). Here, a width of each of the first, second, and third sections is ($2/3$)DE. Namely, each of the first, second, third, fourth, fifth, and sixth sub-pixels SP11, SP12, SP13, SP21, SP22, and SP23 has the data charging time of ($2/3$)DE. Accordingly, each of the sub-pixels SP11, SP12, SP13, SP21, SP22, and SP23 can have the increased data charging time compared to the DRD structure.

As described above, in the display device according to the first aspect of the present disclosure, since three sub-pixels of one horizontal pixel row are connected to two data lines, the number of channels of the data driving portion can be reduced compared to the SRD structure in which three sub-pixels of one horizontal pixel row are connected to three data lines. Accordingly, the size and/or number of data driving portion decreases, thereby reducing the manufacturing costs.

In addition, since the sub-pixels of two horizontal pixel rows are connected to three gate lines, the number of gate lines can be reduced compared to the DRD structure in which the sub-pixels of two horizontal pixel rows are connected to four gate lines, and the data charging time can be increased. Accordingly, the display quality can be improved. Further, a design margin can be additionally secured, the aperture ratio can be increased, and the lifespan of the display device can be increased.

Figure 6:
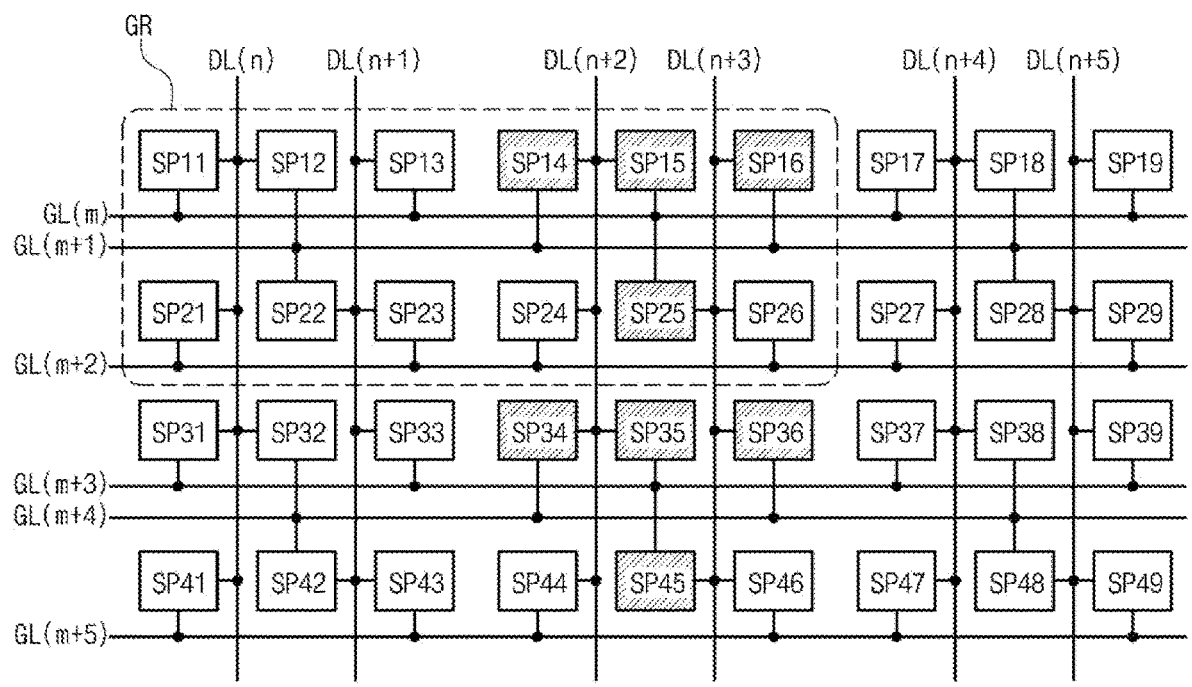
FIG. 6 is a schematic view of a display device according to a second aspect of the present disclosure.

FIG. 6 is a schematic view of a display device according to a second aspect of the present disclosure. In the display device according to the second aspect of the present disclosure, the connection structure of the sub-pixels SP14, SP15, SP16, SP25, SP34, SP35, SP36, and SP45 is different from the first aspect.

In FIG. 6, the display device according to the second aspect of the present disclosure includes a plurality of gate lines GL(m) to GL(m+5), a plurality of data lines DL(n) to DL(n+5), and a plurality of sub-pixels SP11 to SP49. Here, m and n are natural numbers.

The plurality of gate lines GL(m) to GL(m+5) extend in a first direction, and the plurality of data lines DL(n) to DL(n+5) extend in a second direction and cross the plurality of gate lines GL(m) to GL(m+5).

When m and n are 1, the plurality of gate lines GL(m) to GL(m+5) may be first to sixth gate lines GL1 to GL6, respectively, and the plurality of data lines DL(n) to DL(n+5) may be first to sixth data lines DL1 to DL6, respectively.

The plurality of sub-pixels SP11 to SP49 are arranged in a matrix form, and each of the sub-pixels SP11 to SP49 is connected to one gate line and one data line. At this time, three sub-pixels included in one horizontal pixel row are connected to two gate lines and two data lines.

The plurality of sub-pixels SP11 to SP49 may include first to thirty-sixth sub-pixels, and the sub-pixels SP11 to SP49 may be arranged in four rows and nine columns.

Here, in the sub-pixels SP11 to SP49, twelve sub-pixels of two rows and six columns form one group and are repeatedly arranged with the same connection structure for three gate lines and four data lines.

For example, twelve sub-pixels SP11, SP12, SP13, SP14, SP15, SP16, SP21, SP22, SP23, SP24, SP25, and SP26 arranged in two rows and six columns may form one group GR and may be defined as first, second, third, fourth, fifth, sixth, seventh, eighth, ninth, tenth, eleventh, and twelfth sub-pixels, respectively. At this time, a first horizontal pixel row of a first row may include the first, second, third, fourth, fifth, and sixth sub-pixels SP11, SP12, SP13, SP14, SP15, and SP16 sequentially arranged in the first direction, and a second horizontal pixel row of a second row may include the seventh, eighth, ninth, tenth, eleventh, and twelfth sub-pixels SP21, SP22, SP23, SP24, SP25, and SP26 sequentially arranged in the first direction. The first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 are connected to first, second, and third gate lines GL(m), GL(m+1), and GL(m+2) and first, second, third, and fourth data lines DL(n), DL(n+1), DL(n+2), and DL(n+3).

Specifically, in the first horizontal pixel row, the first sub-pixel SP11 is connected to the first gate line GL(m) and the first data line DL(n), the second sub-pixel SP12 is connected to the second gate line GL(m+1) and the first data line DL(n), the third sub-pixel SP13 is connected to the first gate line GL(m) and the second data line DL(n+1), the fourth sub-pixel SP14 is connected to the second gate line GL(m+1) and the third data line DL(n+2), the fifth sub-pixel SP15 is connected to the first gate line GL(m) and the third data line DL(n+2), and the sixth sub-pixel SP16 is connected to the second gate line GL(m+1) and the fourth data line DL(n+3).

In the second horizontal pixel row, the seventh sub-pixel SP21 is connected to the third gate line GL(m+2) and the first data line DL(n), the eighth sub-pixel SP22 is connected to the second gate line GL(m+1) and the second data line DL(n+1), the ninth sub-pixel SP23 is connected to the third gate line GL(m+2) and the second data line DL(n+1), the tenth sub-pixel SP24 is connected to the third gate line GL(m+2) and the third data line DL(n+2), the eleventh sub-pixel SP25 is connected to the first gate line GL(m) and the fourth data line DL(n+3), and the twelfth sub-pixel SP26 is connected to the third gate line GL(m+2) and the fourth data line DL(n+3).

Next, the twelve sub-pixels SP31, SP32, SP33, SP34, SP35, SP36, SP41, SP42, SP43, SP44, SP45, and SP46 arranged in two row and six columns are connected to the fourth, fifth, and sixth gate lines GL(m+3), GL(m+4), and GL(m+5) and the first, second, third, and fourth data lines DL(n), DL(n+1), DL(n+2), and DL(n+3) in the same way.

A driving method of the display device according to the second aspect of the present disclosure will be described with reference to FIG. 7.

Figure 7:
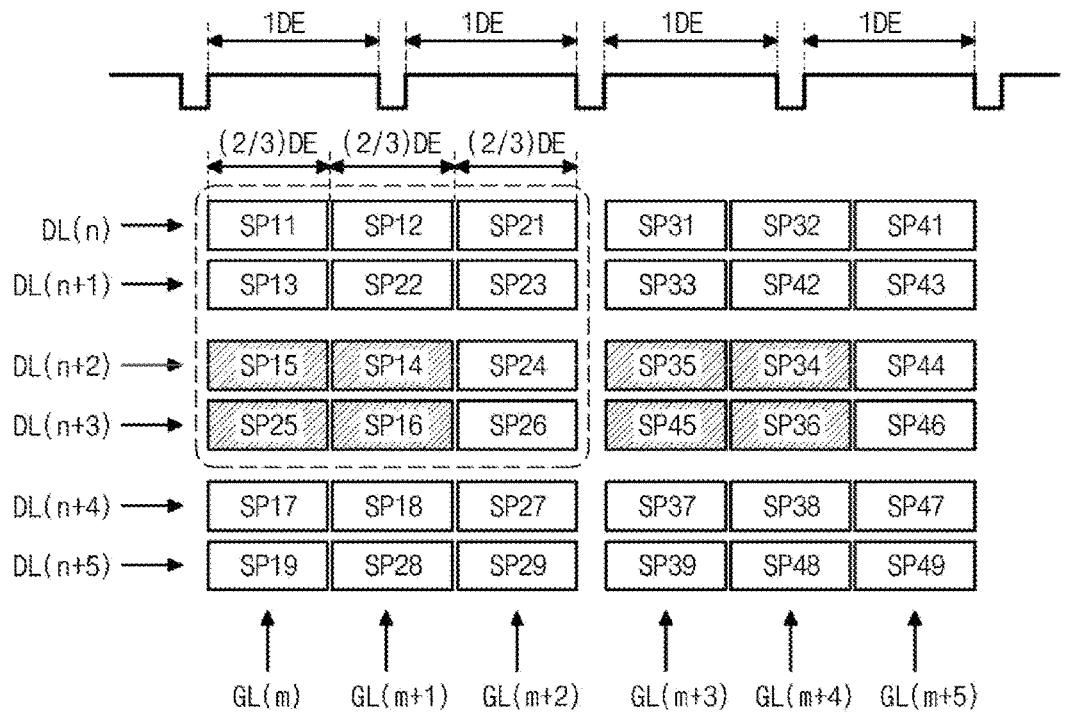
FIG. 7 is a timing diagram of the display device according to the second aspect of the present disclosure.

FIG. 7 is a timing diagram of the display device according to the second aspect of the present disclosure, and it will be described with reference to FIG. 6 together.

In FIG. 7, data voltages are applied to the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 of two horizontal pixel rows for two horizontal periods 2H in which two data enable (DE) signals are applied. That is, the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 have the data charging time of 2DE.

At this time, the data voltages are applied to the first sub-pixel SP11, the third sub-pixel SP13, the fifth sub-pixel SP15, and the eleventh sub-pixel SP25 for a first section in which the gate signal is applied to the first gate line GL(m), the data voltages are applied to the second sub-pixel SP12, the eighth sub-pixel SP22, the fourth sub-pixel SP14, and the sixth sub-pixel SP16 for a second section in which the gate signal is applied to the second gate line GL(m+1), and the data voltages are applied to the seventh sub-pixel SP21, the ninth sub-pixel SP23, the tenth sub-pixel SP24, and the twelfth sub-pixel SP26 for a third section in which the gate signal is applied to the third gate line GL(m+2).

Here, a width of each of the first, second, and third sections is (⅔)DE. Namely, each of the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 has the data charging time of (⅔)DE. Accordingly, each of the sub-pixels SP11 to SP26 can have the increased data charging time compared to the DRD structure.

The display device according to the second aspect of the present disclosure may be advantageous for a structure in which four sub-pixels constitute one pixel compared to the first aspect.

Figure 8:
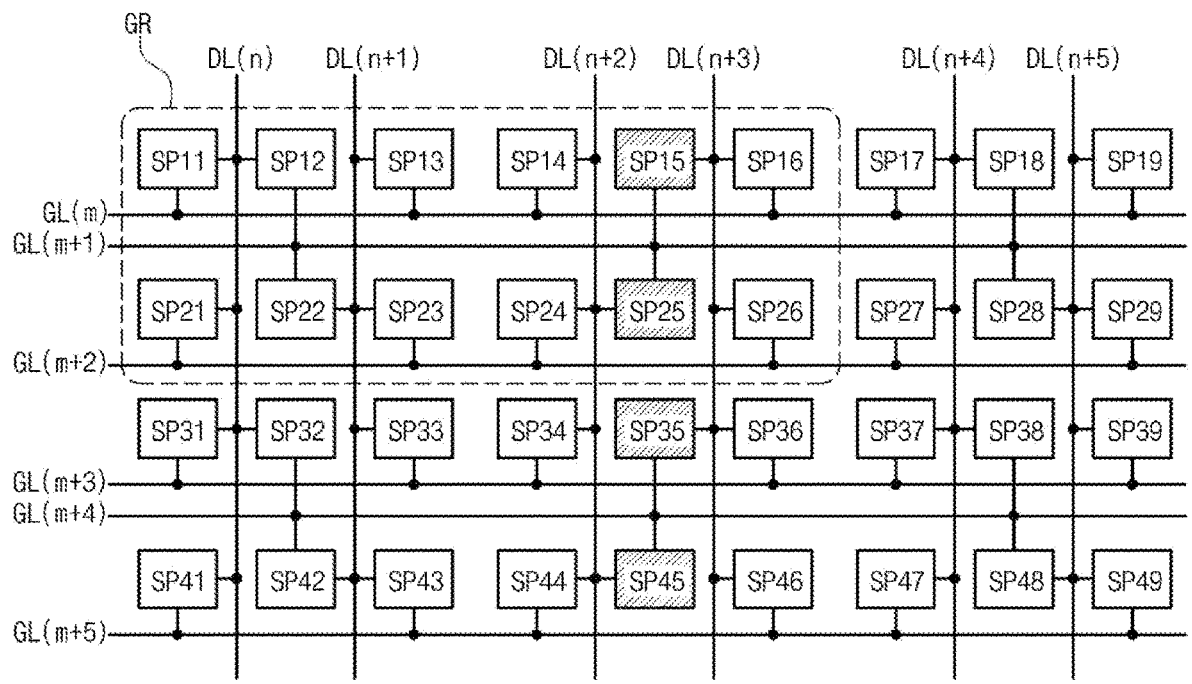
FIG. 8 is a schematic view of a display device according to a third aspect of the present disclosure.

FIG. 8 is a schematic view of a display device according to a third aspect of the present disclosure. In the display device according to the third aspect of the present disclosure, the connection structure of the sub-pixels SP15, SP25, SP35, and SP45 is different from the first aspect.

In FIG. 8, the display device according to the third aspect of the present disclosure includes a plurality of gate lines GL(m) to GL(m+5), a plurality of data lines DL(n) to DL(n+5), and a plurality of sub-pixels SP11 to SP49. Here, m and n are natural numbers.

The plurality of gate lines GL(m) to GL(m+5) extend in a first direction, and the plurality of data lines DL(n) to DL(n+5) extend in a second direction and cross the plurality of gate lines GL(m) to GL(m+5).

When m and n are 1, the plurality of gate lines GL(m) to GL(m+5) may be first to sixth gate lines GL1 to GL6, respectively, and the plurality of data lines DL(n) to DL(n+5) may be first to sixth data lines DL1 to DL6, respectively.

The plurality of sub-pixels SP11 to SP49 are arranged in a matrix form, and each of the sub-pixels SP11 to SP49 is connected to one gate line and one data line. At this time, three sub-pixels included in one horizontal pixel row are connected to two gate lines and two data lines.

The plurality of sub-pixels SP11 to SP49 may include first to thirty-sixth sub-pixels, and the sub-pixels SP11 to SP49 may be arranged in four rows and nine columns.

Here, in the sub-pixels SP11 to SP49, twelve sub-pixels of two rows and six columns form one group and are repeatedly arranged with the same connection structure for three gate lines and four data lines.

For example, twelve sub-pixels SP11, SP12, SP13, SP14, SP15, SP16, SP21, SP22, SP23, SP24, SP25, and SP26 arranged in two rows and six columns may form one group GR and may be defined as first, second, third, fourth, fifth, sixth, seventh, eighth, ninth, tenth, eleventh, and twelfth sub-pixels, respectively. At this time, a first horizontal pixel row of a first row may include the first, second, third, fourth, fifth, and sixth sub-pixels SP11, SP12, SP13, SP14, SP15, and SP16 sequentially arranged in the first direction, and a second horizontal pixel row of a second row may include the seventh, eighth, ninth, tenth, eleventh, and twelfth sub-pixels SP21, SP22, SP23, SP24, SP25, and SP26 sequentially arranged in the first direction. The first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 are connected to first, second, and third gate lines GL(m), GL(m+1), and GL(m+2) and first, second, third, and fourth data lines DL(n), DL(n+1), DL(n+2), and DL(n+3).

Specifically, in the first horizontal pixel row, the first sub-pixel SP11 is connected to the first gate line GL(m) and the first data line DL(n), the second sub-pixel SP12 is connected to the second gate line GL(m+1) and the first data line DL(n), the third sub-pixel SP13 is connected to the first gate line GL(m) and the second data line DL(n+1), the fourth sub-pixel SP14 is connected to the first gate line GL(m) and the third data line DL(n+2), the fifth sub-pixel SP15 is connected to the second gate line GL(m+1) and the fourth data line DL(n+3), and the sixth sub-pixel SP16 is connected to the first gate line GL(m) and the fourth data line DL(n+3).

In the second horizontal pixel row, the seventh sub-pixel SP21 is connected to the third gate line GL(m+2) and the first data line DL(n), the eighth sub-pixel SP22 is connected to the second gate line GL(m+1) and the second data line DL(n+1), the ninth sub-pixel SP23 is connected to the third gate line GL(m+2) and the second data line DL(n+1), the tenth sub-pixel SP24 is connected to the third gate line GL(m+2) and the third data line DL(n+2), the eleventh sub-pixel SP25 is connected to the second gate line GL(m+1) and the third data line DL(n+2), and the twelfth sub-pixel SP26 is connected to the third gate line GL(m+2) and the fourth data line DL(n+3).

Next, the twelve sub-pixels SP31, SP32, SP33, SP34, SP35, SP36, SP41, SP42, SP43, SP44, SP45, and SP46 arranged in two row and six columns are connected to the fourth, fifth, and sixth gate lines GL(m+3), GL(m+4), and GL(m+5) and the first, second, third, and fourth data lines DL(n), DL(n+1), DL(n+2), and DL(n+3) in the same way.

A driving method of the display device according to the third aspect of the present disclosure will be described with reference to FIG. 9.

Figure 9:
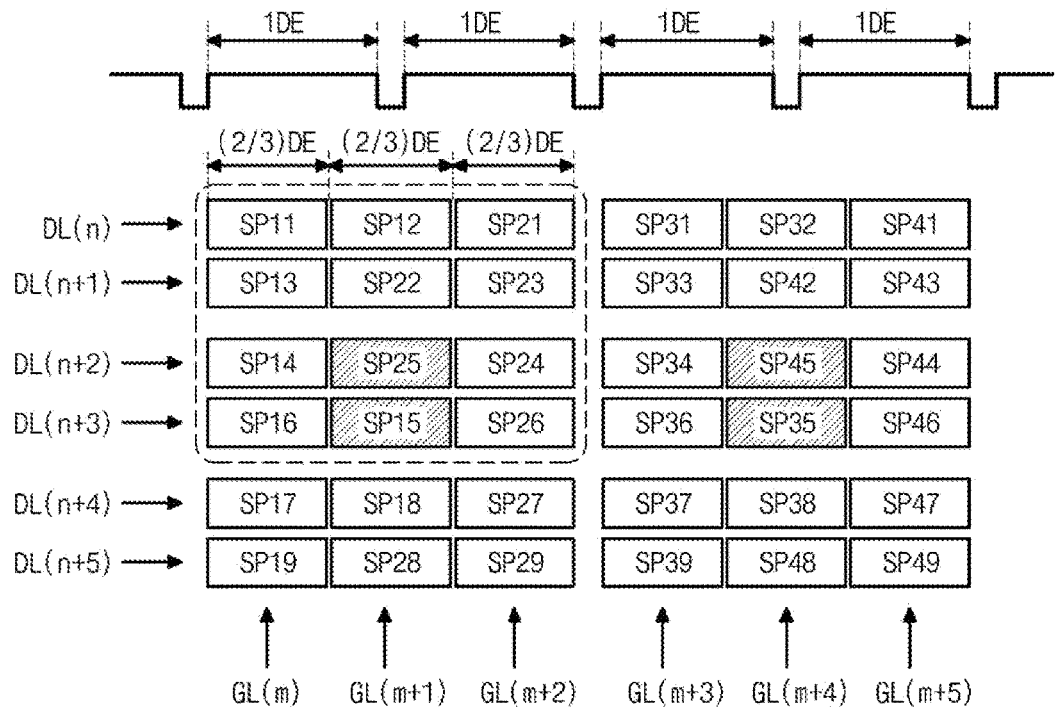
FIG. 9 is a timing diagram of the display device according to the third aspect of the present disclosure.

FIG. 9 is a timing diagram of the display device according to the third aspect of the present disclosure, and it will be described with reference to FIG. 8 together.

In FIG. 9, data voltages are applied to the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 of two horizontal pixel rows for two horizontal periods 2H in which two data enable (DE) signals are applied. That is, the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 have the data charging time of 2DE.

At this time, the data voltages are applied to the first sub-pixel SP11, the third sub-pixel SP13, the fourth sub-pixel SP14, and the sixth sub-pixel SP16 for a first section in which the gate signal is applied to the first gate line GL(m), the data voltages are applied to the second sub-pixel SP12, the eighth sub-pixel SP22, the eleventh sub-pixel SP25, and the fifth sub-pixel SP15 for a second section in which the gate signal is applied to the second gate line GL(m+1), and the data voltages are applied to the seventh sub-pixel SP21, the ninth sub-pixel SP23, the tenth sub-pixel SP24, and the twelfth sub-pixel SP26 for a third section in which the gate signal is applied to the third gate line GL(m+2).

Here, a width of each of the first, second, and third sections is (⅔)DE. Namely, each of the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 has the data charging time of (⅔)DE. Accordingly, each of the sub-pixels SP11 to SP26 can have the increased data charging time compared to the DRD structure.

In the display device according to the third aspect of the present disclosure, since there is less possibility that deterioration may occur periodically compared to the first aspect, better image quality can be implemented even if deterioration occurs.

Figure 10:
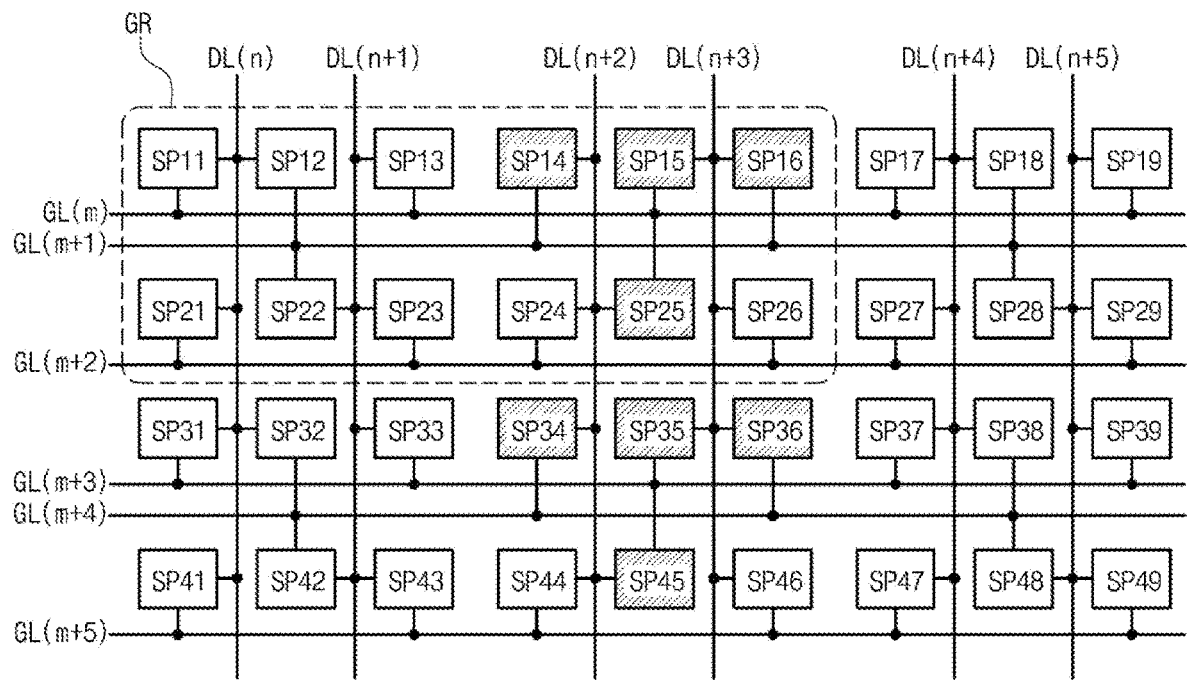
FIG. 10 is a schematic view of a display device according to a fourth aspect of the present disclosure.

FIG. 10 is a schematic view of a display device according to a fourth aspect of the present disclosure. In the display device according to the fourth aspect of the present disclosure, the connection structure of the sub-pixels SP14, SP15, SP16, SP25, SP34, SP35, SP36, and SP45 is different from the first aspect.

In FIG. 10, the display device according to the fourth aspect of the present disclosure includes a plurality of gate lines GL(m) to GL(m+5), a plurality of data lines DL(n) to DL(n+5), and a plurality of sub-pixels SP11 to SP49. Here, m and n are natural numbers.

The plurality of gate lines GL(m) to GL(m+5) extend in a first direction, and the plurality of data lines DL(n) to DL(n+5) extend in a second direction and cross the plurality of gate lines GL(m) to GL(m+5).

When m and n are 1, the plurality of gate lines GL(m) to GL(m+5) may be first to sixth gate lines GL1 to GL6, respectively, and the plurality of data lines DL(n) to DL(n+5) may be first to sixth data lines DL1 to DL6, respectively.

The plurality of sub-pixels SP11 to SP49 are arranged in a matrix form, and each of the sub-pixels SP11 to SP49 is connected to one gate line and one data line. At this time, three sub-pixels included in one horizontal pixel row are connected to two gate lines and two data lines.

The plurality of sub-pixels SP11 to SP49 may include first to thirty-sixth sub-pixels, and the sub-pixels SP11 to SP49 may be arranged in four rows and nine columns.

Here, in the sub-pixels SP11 to SP49, twelve sub-pixels of two rows and six columns form one group and are repeatedly arranged with the same connection structure for three gate lines and four data lines.

For example, twelve sub-pixels SP11, SP12, SP13, SP14, SP15, SP16, SP21, SP22, SP23, SP24, SP25, and SP26 arranged in two rows and six columns may form one group GR and may be defined as first, second, third, fourth, fifth, sixth, seventh, eighth, ninth, tenth, eleventh, and twelfth sub-pixels, respectively. At this time, a first horizontal pixel row of a first row may include the first, second, third, fourth, fifth, and sixth sub-pixels SP11, SP12, SP13, SP14, SP15, and SP16 sequentially arranged in the first direction, and a second horizontal pixel row of a second row may include the seventh, eighth, ninth, tenth, eleventh, and twelfth sub-pixels SP21, SP22, SP23, SP24, SP25, and SP26 sequentially arranged in the first direction. The first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 are connected to first, second, and third gate lines GL(m), GL(m+1), and GL(m+2) and first, second, third, and fourth data lines DL(n), DL(n+1), DL(n+2), and DL(n+3).

Specifically, in the first horizontal pixel row, the first sub-pixel SP11 is connected to the first gate line GL(m) and the first data line DL(n), the second sub-pixel SP12 is connected to the second gate line GL(m+1) and the first data line DL(n), the third sub-pixel SP13 is connected to the first gate line GL(m) and the second data line DL(n+1), the fourth sub-pixel SP14 is connected to the second gate line GL(m+1) and the third data line DL(n+2), the fifth sub-pixel SP15 is connected to the first gate line GL(m) and the fourth data line DL(n+3), and the sixth sub-pixel SP16 is connected to the second gate line GL(m+1) and the fourth data line DL(n+3).

In the second horizontal pixel row, the seventh sub-pixel SP21 is connected to the third gate line GL(m+2) and the first data line DL(n), the eighth sub-pixel SP22 is connected to the second gate line GL(m+1) and the second data line DL(n+1), the ninth sub-pixel SP23 is connected to the third gate line GL(m+2) and the second data line DL(n+1), the tenth sub-pixel SP24 is connected to the third gate line GL(m+2) and the third data line DL(n+2), the eleventh sub-pixel SP25 is connected to the first gate line GL(m) and the third data line DL(n+2), and the twelfth sub-pixel SP26 is connected to the third gate line GL(m+2) and the fourth data line DL(n+3).

Next, the twelve sub-pixels SP31, SP32, SP33, SP34, SP35, SP36, SP41, SP42, SP43, SP44, SP45, and SP46 arranged in two row and six columns are connected to the fourth, fifth, and sixth gate lines GL(m+3), GL(m+4), and GL(m+5) and the first, second, third, and fourth data lines DL(n), DL(n+1), DL(n+2), and DL(n+3) in the same way.

A driving method of the display device according to the fourth aspect of the present disclosure will be described with reference to FIG. 11.

Figure 11:
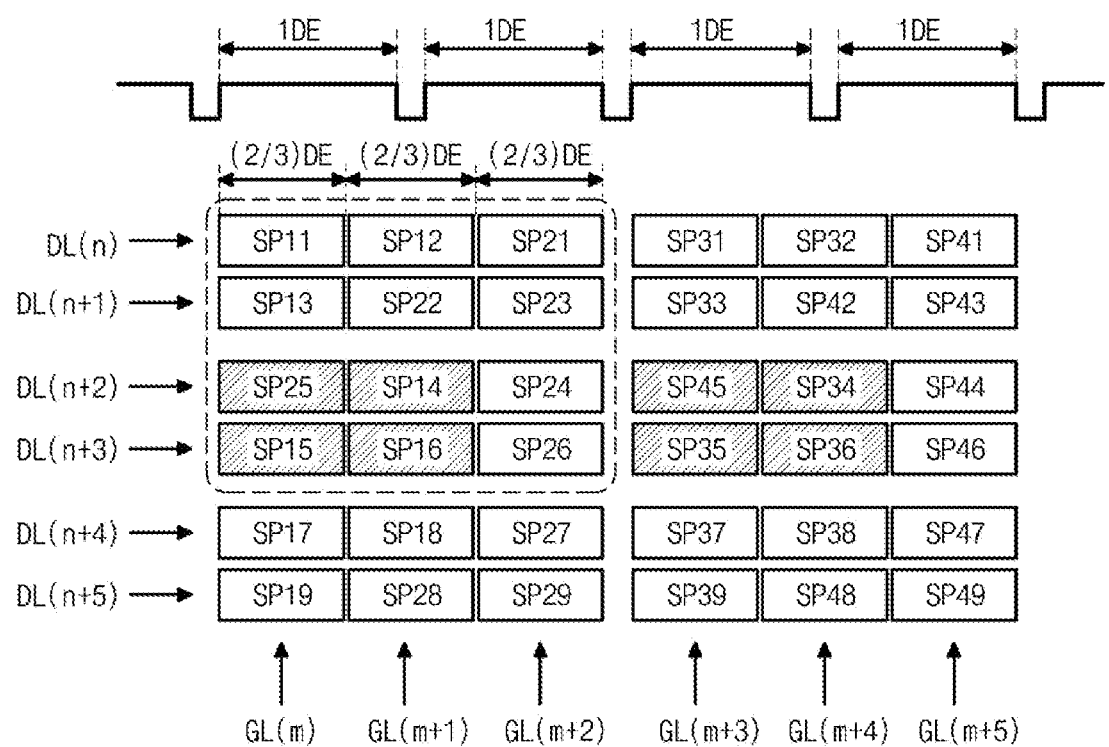
FIG. 11 is a timing diagram of the display device according to the fourth aspect of the present disclosure.

FIG. 11 is a timing diagram of the display device according to the fourth aspect of the present disclosure, and it will be described with reference to FIG. 10 together.

In FIG. 11, data voltages are applied to the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 of two horizontal pixel rows for two horizontal periods 2H in which two data enable (DE) signals are applied. That is, the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 have the data charging time of 2DE.

At this time, the data voltages are applied to the first sub-pixel SP11, the third sub-pixel SP13, the eleventh sub-pixel SP25, and the fifth sub-pixel SP15 for a first section in which the gate signal is applied to the first gate line GL(m), the data voltages are applied to the second sub-pixel SP12, the eighth sub-pixel SP22, the fourth sub-pixel SP14, and the sixth sub-pixel SP16 for a second section in which the gate signal is applied to the second gate line GL(m+1), and the data voltages are applied to the seventh sub-pixel SP21, the ninth sub-pixel SP23, the tenth sub-pixel SP24, and the twelfth sub-pixel SP26 for a third section in which the gate signal is applied to the third gate line GL(m+2).

Here, a width of each of the first, second, and third sections is (⅔)DE. Namely, each of the first, second, third, fourth, fifth, sixth, seventh, eighth, ninth, tenth, eleventh, and twelfth sub-pixels SP11, SP12, SP13, SP14, SP15, SP16, SP21, SP22, SP23, SP24, SP25, and SP26 has the data charging time of (⅔)DE. Accordingly, each of the sub-pixels SP11 to SP26 can have the increased data charging time compared to the DRD structure.

The display device according to the fourth aspect of the present disclosure may be advantageous for a structure in which four sub-pixels constitute one pixel compared to the first aspect. Additionally, in the display device according to the fourth aspect of the present disclosure, since there is less possibility that deterioration may occur periodically compared to the first aspect, better image quality can be implemented even if deterioration occurs.

In the present disclosure, by connecting three sub-pixels of one horizontal pixel row to two data lines, the number of channels of the data driving portion is reduced, so that the manufacturing costs can be decreased.

Further, in the present disclosure, by connecting six sub-pixels of two horizontal pixel rows to three gate lines and two data lines, each sub-pixel can have the sufficient data charging time, and thus, the display quality can be improved.

It will be apparent to those skilled in the art that various modifications and variations can be made in the display device of the present disclosure without departing from the technical idea or scope of the disclosure. Thus, it is intended that the present disclosure covers the modifications and variations of this disclosure provided they come within the scope of the appended claims and their equivalents.

What is claimed is:

1. A display device comprising:
   first and second gate lines extending in a first direction;
   first, second, third, and fourth data lines extending in a second direction and crossing the first and second gate lines; and
   a first horizontal pixel row including first, second, and third sub-pixels sequentially disposed in the first direction,
   wherein the first sub-pixel is connected to the first gate line and the first data line,
   the second sub-pixel is connected to the second gate line and the first data line, and
   the third sub-pixel is connected to the first gate line and the second data line,
   wherein a sub-pixel adjacent to the third sub-pixel along the first direction is connected to the first gate line and the third data line or the second gate line and the third data line,
   wherein the first horizontal pixel row further includes fourth, fifth, and sixth sub-pixels sequentially arranged in the first direction, and
   wherein the fourth sub-pixel is connected to the second gate line and the third data line, the fifth sub-pixel is connected to the first gate line and the third data line, and the sixth sub-pixel is connected to the second gate line and the fourth data line,
   wherein the fourth sub-pixel is connected to the first gate line and the third data line, the fifth sub-pixel is connected to the second gate line and the fourth data line, and the sixth sub-pixel is connected to the first gate line and the fourth data line, or
   wherein the fourth sub-pixel is connected to the second gate line and the third data line, the fifth sub-pixel is connected to the first gate line and the fourth data line, and the sixth sub-pixel is connected to the second gate line and the fourth data line.

2. The display device of claim 1, wherein in each of the first sub-pixel, the second sub-pixel and the third sub-pixel, a thin film transistor, a liquid crystal capacitor and a storage capacitor are formed, or a switching thin film transistor, a driving thin film transistor, a storage capacitor and a light emitting diode are formed.

3. The display device of claim 1, further comprising:
   a third gate line extending in the first direction; and
   a second horizontal pixel row including seventh, eighth, and ninth sub-pixels sequentially disposed in the first direction,
   wherein the seventh sub-pixel is connected to the third gate line and the first data line,
   the eighth sub-pixel is connected to the second gate line and the second data line, and
   the ninth sub-pixel is connected to the third gate line and the second data line.

4. The display device of claim 3, further comprising:
   fourth, fifth and sixth gate lines extending in the first direction;
   a third horizontal pixel row including tenth, eleventh and twelfth sub-pixels sequentially arranged in the first direction; and
   a fourth horizontal pixel row including thirteenth, fourteenth, and fifteenth sub-pixels sequentially arranged in the first direction,
   wherein the tenth sub-pixel is connected to the fourth gate line and the first data line, the eleventh sub-pixel is connected to the fifth gate line and the first data line, the twelfth sub-pixel is connected to the fourth gate line and the second data line, the thirteenth sub-pixel is connected to the sixth gate line and the first data line, the fourteenth sub-pixel is connected to the fifth gate line and the second data line, and the fifteenth sub-pixel is connected to the sixth gate line and the second data line.

5. The display device of claim 1, further comprising:
   a third gate line extending in the first direction; and
   a second horizontal pixel row including seventh, eighth, ninth, tenth, eleventh, and twelfth sub-pixels sequentially disposed in the first direction,
   wherein the fourth sub-pixel is connected to the second gate line and the third data line, the fifth sub-pixel is connected to the first gate line and the third data line, and the sixth sub-pixel is connected to the second gate line and the fourth data line, and
   wherein the seventh sub-pixel is connected to the third gate line and the first data line,
   the eighth sub-pixel is connected to the second gate line and the second data line,
   the ninth sub-pixel is connected to the third gate line and the second data line,
   the tenth sub-pixel is connected to the third gate line and the third data line,
   the eleventh sub-pixel is connected to the first gate line and the fourth data line, and
   the twelfth sub-pixel is connected to the third gate line and the fourth data line.

6. The display device of claim 1, further comprising:
   a third gate line extending in the first direction; and a second horizontal pixel row including seventh, eighth, ninth, tenth, eleventh, and twelfth sub-pixels sequentially arranged in the first direction,
wherein the fourth sub-pixel is connected to the first gate line and the third data line, the fifth sub-pixel is connected to the second gate line and the fourth data line, and the sixth sub-pixel is connected to the first gate line and the fourth data line, and
wherein the seventh sub-pixel is connected to the third gate line and the first data line,
the eighth sub-pixel is connected to the second gate line and the second data line, the ninth sub-pixel is connected to the third gate line and the second data line,
the tenth sub-pixel is connected to the third gate line and the third data line,
the eleventh sub-pixel is connected to the second gate line and the third data line, and
the twelfth sub-pixel is connected to the third gate line and the fourth data line.

7. The display device of claim 1, further comprising:
a third gate line extending in the first direction; and
a second horizontal pixel row including seventh, eighth, ninth, tenth, eleventh, and twelfth sub-pixels sequentially disposed in the first direction,
wherein the fourth sub-pixel is connected to the second gate line and the third data line, the fifth sub-pixel is connected to the first gate line and the fourth data line, and the sixth sub-pixel is connected to the second gate line and the fourth data line, and
wherein the seventh sub-pixel is connected to the third gate line and the first data line, the eighth sub-pixel is connected to the second gate line and the second data line,
the ninth sub-pixel is connected to the third gate line and the second data line, the tenth sub-pixel is connected to the third gate line and the third data line,
the eleventh sub-pixel is connected to the first gate line and the third data line, and
the twelfth sub-pixel is connected to the third gate line and the fourth data line.

8. A driving method of a display device, which includes a first horizontal pixel row including first, second, third, fourth, fifth, and sixth sub-pixels sequentially disposed in a first direction and a second horizontal pixel row including seventh, eighth, and ninth sub-pixels sequentially disposed in the first direction, the method comprising:
applying data voltages to the first and third sub-pixels for a first section;
applying data voltages to the second and eighth sub-pixels for a second section; and
applying data voltages to the seventh and ninth sub-pixels for a third section,
wherein the first sub-pixel is connected to a first gate line and a first data line, the second sub-pixel is connected to a second gate line and the first data line, the third sub-pixel is connected to the first gate line and a second data line, and
wherein the fourth sub-pixel is connected to the second gate line and a third data line, the fifth sub-pixel is connected to the first gate line and the third data line, and the sixth sub-pixel is connected to the second gate line and a fourth data line,
wherein the fourth sub-pixel is connected to the first gate line and the third data line, the fifth sub-pixel is connected to the second gate line and the fourth data line, and the sixth sub-pixel is connected to the first gate line and the fourth data line, or wherein the fourth sub-pixel is connected to the second gate line and the third data line, the fifth sub-pixel is connected to the first gate line and the fourth data line, and the sixth sub-pixel is connected to the second gate line and the fourth data line.

9. The method of claim 8, wherein each of the first, second, and third sections is (⅔) data enable.

10. The method of claim 8, wherein the seventh sub-pixel is connected to the a third gate line and the first data line, the eighth sub-pixel is connected to the second gate line and the second data line, and the ninth sub-pixel is connected to the third gate line and the second data line.

11. A driving method of a display device, which includes a first horizontal pixel row including first, second, third, fourth, fifth, and sixth sub-pixels sequentially arranged in a first direction and a second horizontal pixel row including seventh, eighth, ninth, tenth, eleventh, and twelfth sub-pixels sequentially arranged in the first direction, the method comprising:
a first step of applying data voltages to the first and third sub-pixels for a first section;
a second step of applying data voltages to the second and eighth sub-pixels for a second section; and
a third step of applying data voltages to the seventh and ninth sub-pixels for a third section,
wherein the first sub-pixel is connected to a first gate line and a first data line, the second sub-pixel is connected to a second gate line and the first data line, the third sub-pixel is connected to the first gate line and a second data line, and
wherein the fourth sub-pixel is connected to the second gate line and a third data line, the fifth sub-pixel is connected to the first gate line and the third data line, and the sixth sub-pixel is connected to the second gate line and a fourth data line,
wherein the fourth sub-pixel is connected to the first gate line and a third data line, the fifth sub-pixel is connected to the second gate line and a fourth data line, and the sixth sub-pixel is connected to the first gate line and the fourth data line, or
wherein the fourth sub-pixel is connected to the second gate line and a third data line, the fifth sub-pixel is connected to the first gate line and a fourth data line, and the sixth sub-pixel is connected to the second gate line and the fourth data line.

12. The method of claim 11, wherein the fourth sub-pixel is connected to the second gate line and a third data line, the fifth sub-pixel is connected to the first gate line and the third data line, and the sixth sub-pixel is connected to the second gate line and a fourth data line, and
wherein the first step includes applying data voltages to the fifth and eleventh sub-pixels for the first section, the second step includes applying data voltages to the fourth and sixth sub-pixels for the second section, and the third step includes applying data voltages to the tenth and twelfth sub-pixels for the third section.

13. The method of claim 11, wherein the fourth sub-pixel is connected to the first gate line and a third data line, the fifth sub-pixel is connected to the second gate line and a fourth data line, and the sixth sub-pixel is connected to the first gate line and the fourth data line, and
wherein the first step includes applying data voltages to the fourth and sixth sub-pixels for the first section, the second step includes applying data voltages to the eleventh and fifth sub-pixels for the second section, and the third step includes applying data voltages to the tenth and twelfth sub-pixels for the third section.

14. The method of claim 11, wherein the fourth sub-pixel is connected to the second gate line and a third data line, the fifth sub-pixel is connected to the first gate line and a fourth data line, and the sixth sub-pixel is connected to the second gate line and the fourth data line, and wherein the first step includes applying data voltages to the eleventh and fifth sub-pixels for the first section, the second step includes applying data voltages to the fourth and sixth sub-pixels for the second section, and the third step includes applying data voltages to the tenth and twelfth sub-pixels for the third section.

15. The method of claim 11, wherein each of the first, second, and third sections is (⅔) data enable.

16. The method of claim 11, wherein in the first horizontal pixel row, the first sub-pixel is connected to a first gate line and a first data line, the second sub-pixel is connected to a second gate line and the first data line, the third sub-pixel is connected to the first gate line and a second data line, the fourth sub-pixel is connected to the second gate line and a third data line, the fifth sub-pixel is connected to the first gate line and the third data line, and the sixth sub-pixel is connected to the second gate line and a fourth data line, and wherein in the second horizontal pixel row, the seventh sub-pixel is connected to a third gate line and the first data line, the eighth sub-pixel is connected to the second gate line and the second data line, the ninth sub-pixel is connected to the third gate line and the second data line, the tenth sub-pixel is connected to the third gate line and the third data line, the eleventh sub-pixel is connected to the first gate line and the fourth data line, and the twelfth sub-pixel is connected to the third gate line and the fourth data line.

17. The method of claim 11, wherein in the first horizontal pixel row, the first sub-pixel is connected to a first gate line and a first data line, the second sub-pixel is connected to a second gate line and the first data line, the third sub-pixel is connected to the first gate line and a second data line, the fourth sub-pixel is connected to the first gate line and a third data line, the fifth sub-pixel is connected to the second gate line and a fourth data line, and the sixth sub-pixel is connected to the first gate line and the fourth data line, and wherein in the second horizontal pixel row, the seventh sub-pixel is connected to a third gate line and the first data line, the eighth sub-pixel is connected to the second gate line and the second data line, the ninth sub-pixel is connected to the third gate line and the second data line, the tenth sub-pixel is connected to the third gate line and the third data line, the eleventh sub-pixel is connected to the second gate line and the third data line, and the twelfth sub-pixel is connected to the third gate line and the fourth data line.

* * * * *